US012650450B2

(12) United States Patent
Raab et al.

(10) Patent No.: US 12,650,450 B2
(45) Date of Patent: Jun. 9, 2026

(54) METHOD AND DEVICE FOR MEASURING ACTUATORS IN A PROJECTION EXPOSURE APPARATUS FOR SEMICONDUCTOR LITHOGRAPHY

(71) Applicant: Carl Zeiss SMT GmbH, Oberkochen (DE)

(72) Inventors: Markus Raab, Schillingsfuerst (DE); Mohammad Awad, Heidenheim (DE); Matthias Manger, Aalen-Unterkochen (DE); Bastian Keller, Sontheim (DE); Annika Rief, Aalen (DE); Daniel Seitz, Aalen (DE); Alexander Vogler, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 453 days.

(21) Appl. No.: 18/189,562

(22) Filed: Mar. 24, 2023

(65) Prior Publication Data

US 2023/0228798 A1 Jul. 20, 2023

Related U.S. Application Data

(63) Continuation of application No. PCT/EP2021/077830, filed on Oct. 8, 2021.

(30) Foreign Application Priority Data

Oct. 12, 2020 (DE) .......................... 102020212853.7

(51) Int. Cl.
*G01R 27/26* (2006.01)
*G03F 7/00* (2006.01)

(52) U.S. Cl.
CPC ..... *G01R 27/2605* (2013.01); *G03F 7/70266* (2013.01); *G03F 7/7085* (2013.01)

(58) Field of Classification Search
CPC ............ G01R 27/2605; G03F 7/70266; G03F 7/7085; G02B 26/0825; H10N 30/802
See application file for complete search history.

(56) References Cited

U.S. PATENT DOCUMENTS

| 4,658,155 A | 4/1987 | Ohba et al. | |
| 7,034,436 B2* | 4/2006 | Chemisky | ............ H10N 30/802 |
| | | | 310/316.03 |

(Continued)

FOREIGN PATENT DOCUMENTS

| JP | 2010-067341 A | 3/2010 |
| JP | 2014-190985 A | 10/2014 |

(Continued)

OTHER PUBLICATIONS

Translation of Japanese Office Action for corresponding JP Appl No. 2023-521894, dated Jan. 30, 2024.

(Continued)

*Primary Examiner* — Lee E Rodak
*Assistant Examiner* — Zannatul Ferdous
(74) *Attorney, Agent, or Firm* — Fish & Richardson P.C.

(57) ABSTRACT

A method for measuring an actuator in a projection exposure apparatus for semiconductor lithography, comprises: driving and deflecting a first actuator with a constant control signal; deflecting a further actuator by way of the mechanical coupling; and determining the capacitance of the further actuator, which was deflected by way of the coupling. A projection exposure apparatus for semiconductor lithography comprises a control device and a measuring device, wherein the measuring device is configured to determine the capacitance of at least one actuator in the projection exposure apparatus.

17 Claims, 5 Drawing Sheets

(56) References Cited

U.S. PATENT DOCUMENTS

| | | | |
|---|---|---|---|
| 2002/0096642 A1* | 7/2002 | Massie | G01Q 10/06 250/453.11 |
| 2002/0174690 A1* | 11/2002 | Gouskov | C03B 37/01493 65/382 |
| 2008/0240200 A1* | 10/2008 | Borgmann | F02D 41/2096 73/114.77 |
| 2010/0001618 A1* | 1/2010 | Fukagawa | F02D 41/2096 310/317 |
| 2010/0060966 A1* | 3/2010 | Cheong | H10N 30/101 359/1 |
| 2011/0235012 A1 | 9/2011 | Fischer et al. | |
| 2014/0336969 A1 | 11/2014 | Barrault | |
| 2016/0025964 A1* | 1/2016 | Torayashiki | G02B 6/3586 359/221.2 |
| 2018/0196253 A1 | 7/2018 | Kwan et al. | |
| 2018/0348074 A1* | 12/2018 | Okada | G01L 3/106 |
| 2019/0275792 A1* | 9/2019 | Nishimura | B41J 2/04528 |

FOREIGN PATENT DOCUMENTS

| | | |
|---|---|---|
| JP | 2018-534602 A | 11/2018 |
| JP | 2019-510451 A | 4/2019 |
| TW | 201624148 A | 7/2016 |
| WO | WO 03/032409 A2 | 4/2003 |
| WO | WO2017050926 A1 | 3/2017 |
| WO | WO2017118732 A1 | 7/2017 |
| WO | WO 2020/207684 A1 | 10/2020 |

OTHER PUBLICATIONS

German Office Action, with translation thereof, for corresponding DE Appl No. 10 2020 212 853.7, dated Apr. 14, 2021.

International Search Report and Written Opinion for corresponding PCT Appl No. PCT/EP2021/077830, dated Jan. 26, 2022.

Japanese Office Action, with English summary, for corresponding JP Appl No. 2023-521894, dated Jan. 30, 2024.

Office Action in Taiwanese Appln. No. 110137500, mailed on Jun. 16, 2025, 11 pages (with English translation).

Office Action in German Appln. No. 10 2020 212 853.7, mailed on Apr. 1, 2026, 6 pages (with English translation).

* cited by examiner

METHOD AND DEVICE FOR MEASURING ACTUATORS IN A PROJECTION EXPOSURE APPARATUS FOR SEMICONDUCTOR LITHOGRAPHY

CROSS-REFERENCE TO RELATED APPLICATIONS

The present application is a continuation of, and claims benefit under 35 USC 120 to, international application PCT/EP2021/077830, filed Oct. 8, 2021, which claims benefit under 35 USC 119 of German Application No. 10 2020 212 853.7, filed Oct. 12, 2020. The entire disclosure of these applications are incorporated by reference herein.

FIELD

The disclosure relates to a method and a device for measuring actuators in a projection exposure apparatus or in a projection lens for semiconductor lithography.

BACKGROUND

Apparatuses can be used for producing extremely fine structures, such as on semiconductor components or other microstructured component parts. The operating principle of the apparatuses involves the production of very fine structures down to the nanometre range by way of generally reducing imaging of structures on a mask, using what is referred to as a reticle, on an element to be structured, a so-called wafer, that is provided with photosensitive material. The minimum dimensions of the structures produced are, in general, directly dependent on the wavelength of the light used. Recently, light sources having an emission wavelength in the range of a few nanometres, for example between 1 nm and 120 nm, such as in the region of 13.5 nm, have increasingly been used. The described wavelength range is also referred to as the EUV range.

Apart from using EUV systems, the microstructured component parts are also produced using the commercially established DUV systems, which have a wavelength of between 100 nm and 400 nm, for example 193 nm or 248 nm. As a result of introducing the EUV range, and hence the possibility of being able to produce even smaller structures, there has also been a further increase in the demands in respect of the optical correction in the competing DUV systems with a wavelength of 193 nm. Additionally, there is usually an increase in the throughput with each new generation of projection exposure apparatuses, independently of the wavelength, so as to increase the profitability; this typically leads to a greater thermal load and hence to more imaging aberrations caused by the heat. To s correct the imaging aberrations, use can be made, inter alia, of manipulators which alter the position and alignment of the optical elements or else influence the imaging properties of the optical elements, for example mirrors, by deforming the optically active surfaces. By way of example, the deformations can be realized by actuators disposed on the back side of a mirror. Since little installation space is available, currently no sensors that are realizable from a technical and economical point of view may be available for determining the topography of the optically active surfaces. Therefore, the actuators are driven in an open control loop. This means that a change in the relationship between the control signal and the deflection of the actuator and/or defects of the actuators or of the connection of the actuators to the mirror cannot be detected.

Impedance spectroscopy, known from the literature to address this issue, can be very expensive and difficult to realize from a technical point of view.

SUMMARY

The disclosure provides a method for measuring an actuator in a projection exposure apparatus for semiconductor lithography, which comprises the following method steps: driving and deflecting a first actuator with a constant control signal and deflecting a further actuator by way of a mechanical coupling with the first actuator; and determining the change in capacitance of the further actuator, which was deflected by way of the coupling.

Here, mechanical coupling of the actuators can be obtained, for example, by virtue of the actuators being formed as piezoelectric or electrostrictive actuators by way of integrating electrodes within a piezoelectrically or electrostrictively active material, for example a piezoceramic. Mechanical coupling is implemented by the piezoceramic itself, which acts like a comparatively rigid spring. The further actuator acts like an adjustable capacitor, the capacitance of which depends, inter alia, on its deflection. Thus, if the deflection of the further actuator is changed as a result of the first actuator being driven and as a result of the mechanical transfer of the deflection of the first actuator to the further actuator, there is a change in the capacitance of the further actuator.

Consequently, conclusions about the conditions at the site of the first actuator can be drawn from determining the current capacitance of the further actuator when the first actuator is deflected. For example, this allows conclusions to be drawn about the quality of the mechanical coupling between the actuators and hence about the integrity of the surrounding material or the state of adhesive bonding sites.

However, deviations in the measured capacitance of the further actuator may also be caused, for example, by a faulty first actuator and defects in the further actuator. In this case, the error can be determined unambiguously by virtue of the capacitance of a plurality of actuators in the surroundings of the first actuator being determined in succession while the first actuator is deflected. The error can be narrowed down by the overview of the data ascertained thus.

The actuators are connected to an optical element of a projection exposure apparatus for semiconductor lithography. For example, the optical element can be a mirror of an EUV projection exposure apparatus or else DUV projection exposure apparatus. For example, the optical element can be part of a projection lens of the projection exposure apparatus.

As a result of the deflection of the first actuator comprising more than 40% of the overall deflection, such as more than 70% of the overall deflection, for example 100% of the overall deflection of the actuator, a sufficient deflection of the further actuator can be achieved in order to generate a measurable influence on the capacitance of the further actuator.

For example, the capacitance of the second actuator can be detected using an AC voltage at a constant frequency. Here, it is possible to choose, for example, a frequency sufficiently far away from the mechanical natural frequencies of the associated apparatus.

It can be desirable for the capacitance is measured with a resolution of at most $10^{-4}$, such as $10^{-5}$, for example $10^{-6}$ of the typical capacitance of the actuators.

In an embodiment the capacitance is detected at a constant temperature. As a result, the influence of the temperature on the capacitance of the further actuator can be removed and hence the meaningfulness of the measurement can be increased.

In one variant, the deflection of the actuators is calibrated by comparing the detected capacitance values with setpoint capacitance values determined when the actuators are put into operation. This renders it possible to ascertain ageing effects of the actuators, for example, and to take these into account when driving the actuators within the scope of normal operation of the apparatus.

A projection exposure apparatus for semiconductor lithography or a projection lens, comprising a device for measuring at least two mechanically coupled actuators, comprising a control device and a measuring device, is distinguished in that the measuring device is configured to determine the capacitance of at least one actuator.

Here, the at least two actuators can be connected to an optical element of the projection exposure apparatus or the projection lens.

The control device can comprise an AC voltage source and a DC voltage source, for example. It is possible to operate the voltage device in the desired voltage range of the actuator. Moreover, a change of the voltage in the low frequency range <50 Hz is expedient.

Furthermore, the control device and the measuring device need not necessarily be realized as separate units; both functionalities could also be integrated in a common assembly.

Should the measuring device comprise a sensor for detecting the temperature when the capacitance is detected, the accuracy of the measurement can be further improved.

BRIEF DESCRIPTION OF THE DRAWINGS

Exemplary embodiments and variants are explained in more detail below with reference to the drawing, in which.

DETAILED DESCRIPTION

Figure 1:
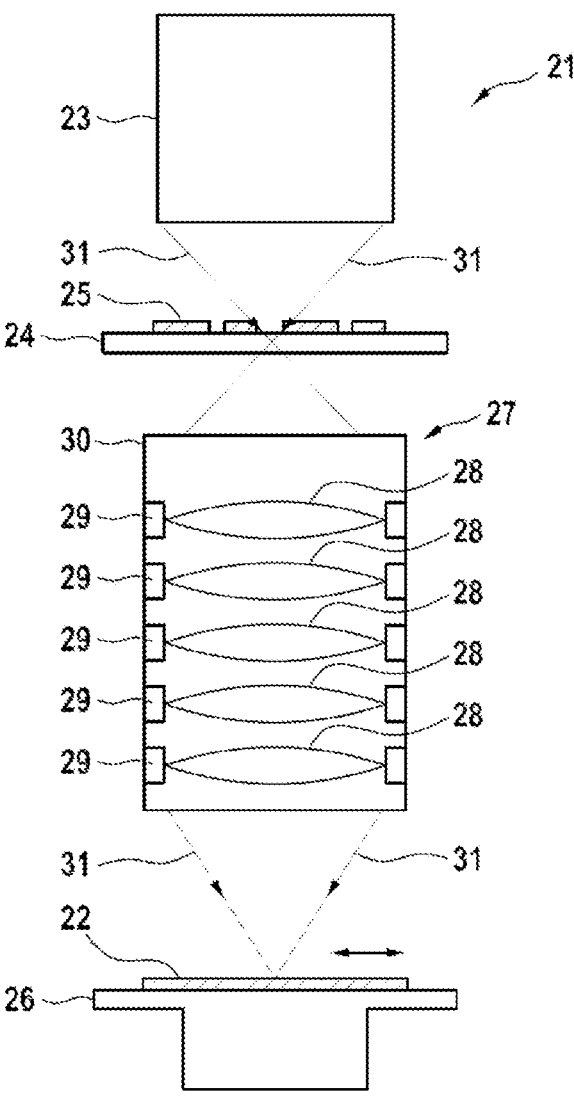
FIG. 1 shows a basic illustration of a DUV projection exposure apparatus.

FIG. 1 illustrates an exemplary DUV projection exposure apparatus 21, in which the disclosure can be used. The projection exposure apparatus 21 serves for the exposure of structures on a substrate which is coated with photosensitive materials, and which generally consists predominantly of silicon and is referred to as a wafer 22, for the production of semiconductor components, such as computer chips.

The projection exposure apparatus 21 in this case substantially comprises an illumination device 23, a reticle holder 24 for receiving and exactly positioning a mask provided with a structure, a so-called reticle 25, by which the later structures on the wafer 22 are determined, a wafer holder 26 for holding, moving and exactly positioning the wafer 22 and an imaging device, to be specific a projection lens 27, with a plurality of optical elements 28, which are held by way of mounts 29 in a lens housing 30 of the projection lens 27.

The basic functional principle in this case provides for the structures introduced into the reticle 25 to be imaged on the wafer 22, the imaging generally reducing the scale.

The illumination device 23 provides a projection beam 31 in the form of electromagnetic radiation, which is used for the imaging of the reticle 25 on the wafer 22, the wavelength range of the radiation lying between 100 nm and 300 nm, for example. A laser, a plasma source or the like can be used as the source of this radiation. Optical elements in the illumination device 23 are used to shape the radiation in such a way that, when it is incident on the reticle 25, the projection beam 31 has the desired properties with regard to diameter, polarization, form of the wavefront and the like.

An image of the reticle 25 is produced by the projection beam 31 and transferred from the projection lens 27 onto the wafer 22 in an appropriately reduced form, as already explained above. In this case, the reticle 25 and the wafer 22 can be moved synchronously, so that regions of the reticle 25 are imaged onto corresponding regions of the wafer 22 virtually continuously during a so-called scanning process. The projection lens 27 has a multiplicity of individual refractive, diffractive and/or reflective optical elements 28, such as for example lens elements, mirrors, prisms, terminating plates and the like, wherein the optical elements 28 can be actuated for example using one or more of the actuator arrangements described here.

Figure 2:
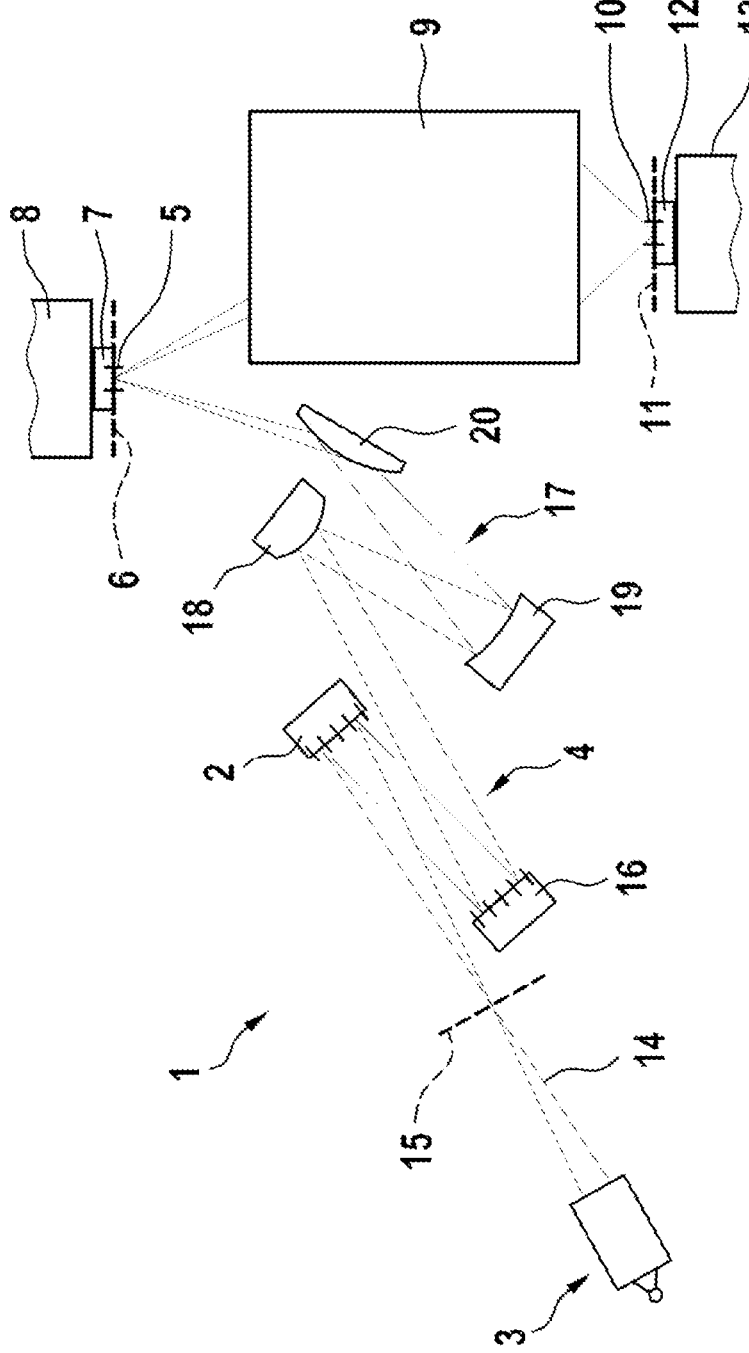
FIG. 2 shows a basic illustration of an EUV projection exposure apparatus.

FIG. 2 shows by way of example the basic construction of a microlithographic EUV projection exposure apparatus 1 in which the disclosure can likewise find application. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned using a collector, which is integrated in the light source 3, in such a way that it passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7 arranged in the object field 5 and held by a schematically illustrated reticle holder 8 is illuminated. A merely schematically illustrated projection lens 9 serves for imaging the object field 5 into an image field 10 in an image plane 11. A structure on the reticle 7 is imaged onto a light-sensitive layer of a wafer 12, which is arranged in the region of the image field 10 in the image plane 11 and held by a likewise partly represented wafer holder 13. The light source 3 can emit used radiation for example in a wavelength range of between 1 nm and 120 nm.

Figure 3A:
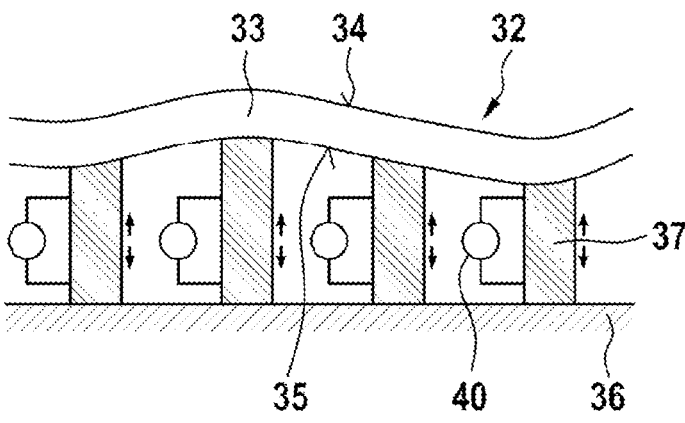
FIGS. 3A-3C show prior art actuator arrangements for deformable mirrors.
Figure 3B:
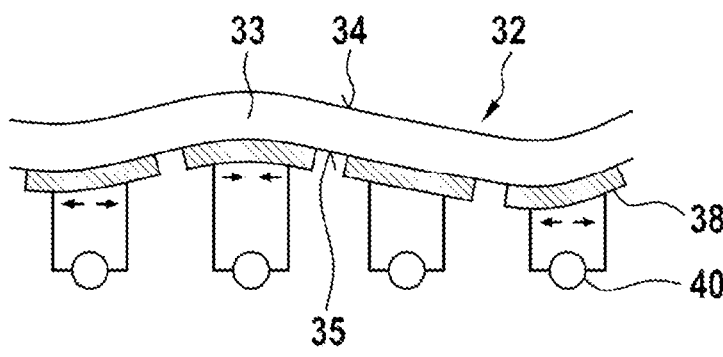
Figure 3C:
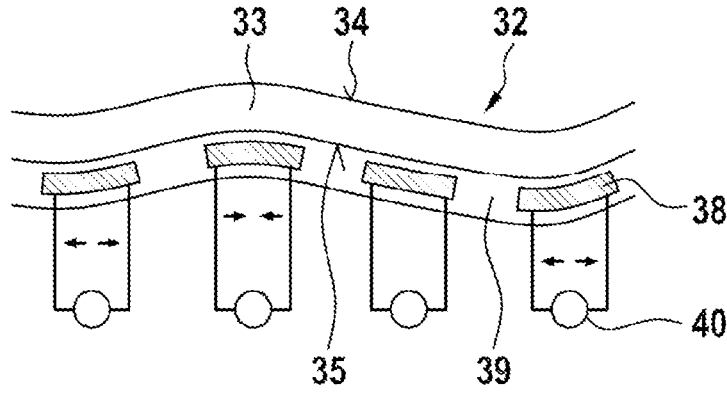

FIGS. 3A to 3C show various actuator arrangements, known from the prior art, for optical elements embodied as deformable mirrors 32, as are used in one of the apparatuses illustrated above.

FIG. 3A shows an actuator arrangement in which actuators 37 are arranged between the back side 35 of the deformable mirror 32 and a frame 36. Each actuator 37 is connected to a control device 40. If, as illustrated in FIG. 3A, the actuators 37 are driven and deflected from their neutral position, there is a deformation of the mirror body 33 and hence of the mirror surface 34 that is relevant to the imaging properties.

FIG. 3B shows a further actuator arrangement in which actuators 38 are arranged at the back side 35 of the deformable mirror 32. The actuators 38 deform the mirror body 33, and hence the mirror surface 34 that is relevant to the imaging properties, by way of a deflection carried out perpendicular to the back side 35 of the mirror body 33. In contrast with the actuators 37 illustrated in FIG. 3A, the deformation of the mirror body 33 is caused by the transverse contraction of the actuator 38 in this case. Like in FIG. 3A, the mirror 32 is illustrated in a deformed state. Usually, the actuators 38 are connected to the mirror back side 35 with pretension, i.e., in an already deflected state, as a result of which the actuators 38 can act in two directions. As described in FIG. 3A, each actuator 38 is connected to a control device 40.

FIG. 3C shows a further alternative actuator arrangement, in which the actuators 38 are embodied as part of an actuator main body 39. The actuator main body 39 comprises the same material as the actuator 38 and the actuators 38 are formed by arranging electrodes (not illustrated) in the actuator main body 39 such that the actuator main body 39 is only deflected in the region of the electrodes. The actuators 38 need not be individually attached to the mirror back side 35 of the mirror 32; instead, a group of actuators 38 can be attached in one component part to the mirror back side 35. The individual actuators 38 are mechanically coupled to one another by way of the actuator main body 39. The basic functionality of the deformation of the mirror body 33 and of the mirror surface 34 is as described in FIG. 3B. Likewise, each actuator 38 is connected to a control device 40.

Figure 4A:
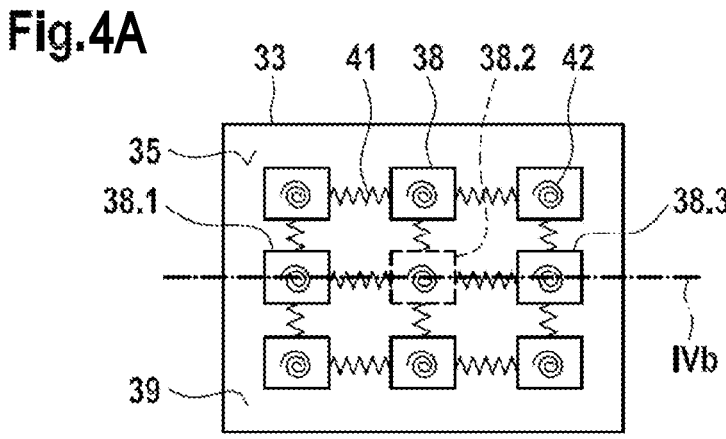
FIGS. 4A-4C show schematic illustrations for elucidating a principle.
Figure 4B:
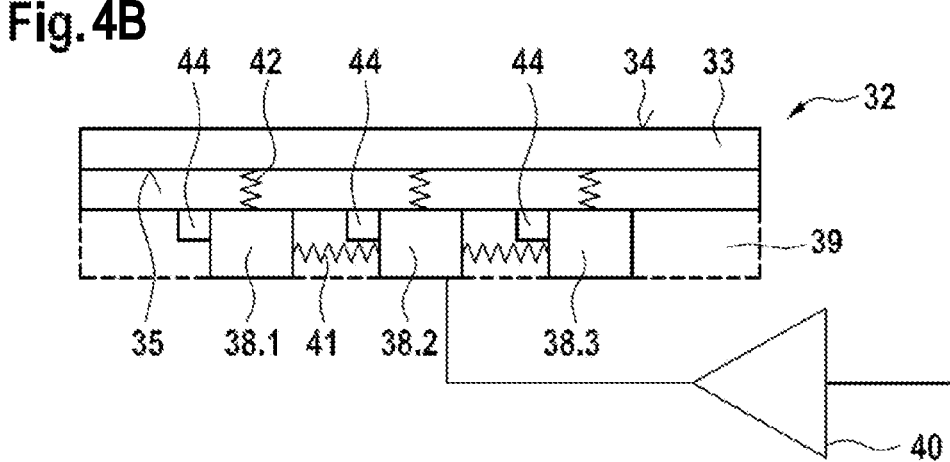
Figure 4C:
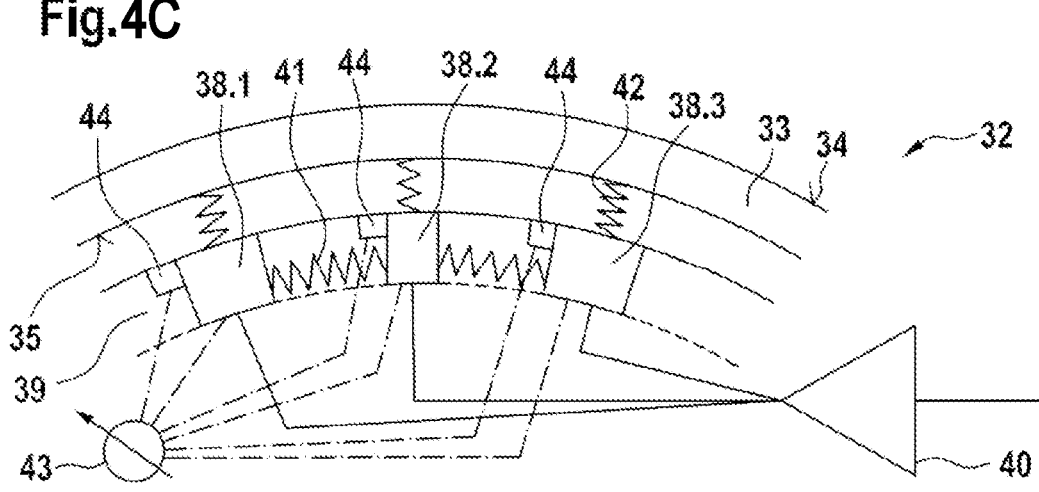

FIGS. 4A to 4C each show an equivalent diagram, which should elucidate the mechanical coupling of the actuators 38 among themselves and to the mirror 32 (FIGS. 4A and 4B) and the measuring principle (FIG. 4C).

Here, FIG. 4A shows a plan view of the back side 35 of a mirror body 33 with an actuator main body 39, the latter comprising nine actuators 38.*x*. The actuators 38.*x* are all mechanically coupled to one another by way of the actuator main body 39, the mechanical coupling of the actuators among themselves being illustrated schematically by the springs 41 and the coupling of the actuators 38.*x* to the mirror body 33 being illustrated schematically by the springs 42. The actuator 38.2, illustrated using dashed lines in FIG. 4A, in the centre of the actuator main body 39 is driven by a control device 40 during the measurement according to the disclosure and deflected with a constant voltage.

FIG. 4B shows a section through the mirror 32 along the line IVb in FIG. 4A. The three actuators 38.1, 38.2, 38.3 are clearly visible in the sectional illustration, the actuator 38.2 being connected to a control device 40 but not yet driven; i.e., the deflection is zero. Sensors 44, which are used to measure the temperature at the site of the actuators 38.*x*, are likewise clearly visible in FIG. 4B.

FIG. 4C, in turn, shows a section through the mirror 32, the actuator 38.2 being driven by the control device 40 with a constant voltage. The actuator 38.2 is deflected perpendicular to the back side 35 of the mirror body 33 and simultaneously contracts parallel to the back side 35 of the mirror body 33. The mirror body 33 is deformed as a result of the coupling between the actuator 38.2 and the mirror body 33. The actuators 38.1, 38.3 are mechanically coupled to the actuator 38.2 via the actuator main body 39 and via the mirror body 33, leading to stress and hence a deformation in the actuators 38.1, 38.3 when the actuator 38.2 is deflected. This leads to a change in capacitance in the case of an electrostrictive or piezoelectric actuator 38.1, 38.3, which can be measured. To this end, the two actuators 38.1 and 38.3, which act as sensors during the measurement, are connected to a measuring device 43. The latter detects the change in capacitance of the actuators 38.1, 38.3 between an unloaded state, as illustrated in FIG. 4B, and a state loaded by stress caused by the deflection of actuator 38.2, as illustrated in FIG. 4C. FIG. 4C illustrates that every actuator 38.1, 38.2, 38.3 is connected to the s control device 40 and the measuring device 43 such that sequential measuring of all actuators 38.1, 38.2, 38.3 is possible.

Naturally, the measuring principle illustrated on the basis of FIGS. 4A to 4C can be applied to very different actuator arrangements in addition to the arrangements shown here in exemplary fashion.

The theoretical background to this measuring process is briefly summarized below:

Equation (1), below, describes the relationship between the strain S of the actuator 38 and the electric field E and the stress G. The material parameter M represents the coupling between mechanical strain and electric field E. The inverse of Young's modulus of the material is represented by s:

$$S = M*E^2 s*\sigma \tag{1}$$

The electric field arises from (2):

$$E = U/d_{layer} \tag{2},$$

where $d_{layer}$ denotes the layer thickness between two electrodes of the actuator 38 and U is the voltage.

Stress σ is calculated by (3) and is formed from the applied force F per unit area A.

$$\sigma = F/A \tag{3}$$

In a manner comparable to linear piezoelectric materials, electrostrictive materials also have an inverse electrostrictive effect ε, which is described in (4):

$$D = \varepsilon*E + 2*M*E*\sigma \tag{4}$$

Consequently, an electric displacement field D arises, which depends on the electric field E and stress σ.

The capacitance C of an electrostrictive actuator can be calculated using (5) from the displacement field D and the applied voltage U. Here, C denotes the capacitance, A denotes the active area of the actuator, N denotes the number of layers and $d_{layer}$ denotes the thickness of the layers.

$$C = (D*A*N)/U \tag{5}$$

From (4) and (5), the capacitance of the actuator arises as $$C = (\varepsilon*A*N)/d_{layer} + (2*M*a*N)/d_{layer} \tag{6}.$$

Here, a constant bias voltage is applied in the case of the electrostrictive actuators 38.1, 38.3 shown here and the capacitance is determined at a constant frequency. Expediently, the measurement is carried out at a constant temperature in order to exclude the influence of a change in temperature on the capacitance measurement. The capacitance measurement can also be applied in the case of piezoactive actuators, wherein the stress, as a result of the piezoelectric effect, can also be determined by a voltage measurement in this type of actuator.

Figure 5:
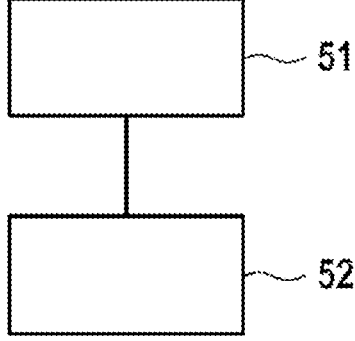
FIG. 5 shows a flowchart for a measuring method.

FIG. 5 shows a flowchart for a method according to the disclosure for measuring an actuator in a projection exposure apparatus, wherein two actuators are mechanically coupled to one another.

In a first method step 51, the first actuator 38.2 is driven and deflected using a constant control signal and a further actuator 38.1, 38.3 is deflected as a result of the mechanical coupling 41.

In a second method step 52, the capacitance of the further actuator 38.1, 38.3, deflected as a result of the coupling, is determined.

LIST OF REFERENCE SIGNS

1 Projection exposure apparatus (EUV)
2 Field facet mirror (EUV)
3 Light source (EUV)
4 Illumination optical unit (EUV)
5 Object field (EUV)
6 Object plane (EUV)
7 Reticle (EUV)
8 Reticle holder (EUV)
9 Projection lens (EUV)
10 Image field (EUV)
11 Image plane (EUV)
12 Wafer (EUV)
13 Wafer holder (EUV)
14 EUV radiation (EUV)
15 Intermediate field focal plane (EUV)
16 Pupil facet mirror (EUV)
17 Assembly (EUV)
18 Mirror (EUV)
19 Mirror (EUV)
20 Mirror (EUV)
21 Projection exposure apparatus (DUV)
22 Wafer (DUV)
23 Illumination optical unit (DUV)
24 Reticle holder (DUV)
25 Reticle (DUV)
26 Wafer holder (DUV)
27 Projection lens (DUV)
28 Optical element (DUV)
29 Mounts (DUV)
30 Lens housing (DUV)
31 Projection beam (DUV)
32 Mirror
33 Mirror body
34 Mirror surface
35 Mirror back side
36 Frame
37 Actuator—controller output perpendicular to the mirror back side
38.1-38.3 Actuator—controller output parallel to the mirror back side
39 Actuator main body
40 Control device
41 Spring (mechanical coupling in the actuator main body)
42 Spring (mechanical coupling with the mirror body)
43 Measuring device
44 Sensor
51 Method step 1
52 Method step 2

What is claimed is:

1. A method of using a semiconductor lithography projection exposure apparatus, the apparatus comprising a first actuator, a second actuator mechanically coupled with the first actuator, and an optical element mechanically coupled to the first and second actuators, the first and second actuators configured to be deflected to deform the optical element, the method comprising:

a) using a first control signal to drive and deflect the first actuator to:
  i) deform the optical element so that the optical element is in a first deformed position; and
  ii) deflect the second actuator due to the mechanical coupling between the first and second actuators so that the second actuator moves from a first position to a deflected position; and
b) after a), determining a change in the capacitance of the second actuator due to the second actuator moving from the first position to the deflected position;
c) based on the change in the capacitance of the second actuator, determining the first deformed position of the optical element; and
d) using a second control signal to drive and deflect the second actuator to deform the optical element to be in a second deformed position.

2. The method of claim 1, wherein the apparatus comprises a projection lens, and the first and second actuators are in the projection lens.

3. The method of claim 1, wherein at least one of the first and second actuators comprises a piezoelectric actuator.

4. The method of claim 1, wherein at least one of the first and second actuators comprises an electrostrictive actuator.

5. The method of claim 1, wherein the optical element comprises a mirror.

6. The method of claim 1, wherein the deflection of the first actuator during b) comprises more than 40% of an overall deflection of the first actuator.

7. The method of claim 1, wherein c) comprises using an AC voltage at a constant frequency to detect the capacitance of the second actuator.

8. The method of claim 1, wherein the change in the capacitance of the second actuator is measured with a resolution of at most $10^{-4}$ of the typical capacitance of the actuators.

9. The method of claim 1, wherein c) comprises using a constant temperature to detect the capacitance of the second actuator.

10. The method of claim 1, further comprising calibrating the deflection of the first and second actuators by comparing a capacitance value of the second actuator when the second actuator is in the deflected position with setpoint capacitance values determined when the first and second actuators are put into operation.

11. The method of claim 10, wherein the projection exposure apparatus comprises a projection lens, and the first and second actuators are in the projection lens.

12. The method of claim 11, wherein the optical element comprises a mirror.

13. The method of claim 1, wherein, during b), a drive signal is not sent to the second actuator.

14. The method of claim 13, wherein the optical element comprises a mirror, and the semiconductor projection exposure apparatus is configured to operate at a wavelength between 1 nanometer and 120 nanometers.

15. The method of claim 1, further comprising, before a), deflecting both the first and second actuators to deform the optical element.

16. The method of claim 1, wherein d) occurs before a).

17. The method of claim 1, wherein d) occurs after c).

* * * * *